United States Patent
Chang et al.

(10) Patent No.: US 7,248,773 B2
(45) Date of Patent: Jul. 24, 2007

(54) METHOD TO TRIM AND SMOOTH HIGH INDEX CONTRAST WAVEGUIDE STRUCTURES

(75) Inventors: Chang Kuo Chang, Singapore (SG); Chi Fo Tsang, Singapore (SG); My The Doan, Singapore (SG); Ramana Murthy Badam, Singapore (SG); Vladimir Bliznetsov, Singapore (SG)

(73) Assignee: Agency For Science, Technology, and Research, Singapore (SG)

( * ) Notice: Subject to any disclaimer, the term of this patent is extended or adjusted under 35 U.S.C. 154(b) by 0 days.

(21) Appl. No.: 11/633,335

(22) Filed: Dec. 4, 2006

(65) Prior Publication Data

US 2007/0090089 A1    Apr. 26, 2007

Related U.S. Application Data

(62) Division of application No. 10/922,541, filed on Aug. 20, 2004, now Pat. No. 7,162,133.

(51) Int. Cl.
 *H01L 21/00* (2006.01)
(52) U.S. Cl. ................. 385/129; 385/130; 385/131; 438/29; 438/31
(58) Field of Classification Search ................. 385/129
See application file for complete search history.

(56) References Cited

U.S. PATENT DOCUMENTS

| 4,028,140 | A | | 6/1977 | Summers et al. | |
|---|---|---|---|---|---|
| 5,079,181 | A | * | 1/1992 | Shimizu et al. | 438/252 |
| 5,949,571 | A | * | 9/1999 | Goossen et al. | 359/291 |
| 6,420,097 | B1 | | 7/2002 | Pike et al. | |
| 6,586,329 | B1 | * | 7/2003 | Tanaka et al. | 438/629 |
| 6,683,308 | B2 | | 1/2004 | Itagaki et al. | |
| 2003/0132381 | A1 | | 7/2003 | Itagaki et al. | |
| 2004/0037497 | A1 | | 2/2004 | Lee | |

FOREIGN PATENT DOCUMENTS

| EP | 0657753 A2 | 6/1995 |
|---|---|---|
| WO | WO 03/044580 A2 | 5/2003 |

OTHER PUBLICATIONS

Graham T. Reed, "The Optical Age of Silicon", Nature Publishing Group 2004, vol. 247, Feb. 12, 2004, pp. 595-596.
M. Ishii et al., "Low-loss fibre-pigtailed 256 channel arrayed-waveguide grating multiplexer using cascaded laterally—tapered waveguides", Electron. Lett, vol. 37, No. 23, Nov. 8, 2001, pp. 1401-1402.

(Continued)

*Primary Examiner*—Frank G. Font
*Assistant Examiner*—Mary El-Shammaa
(74) *Attorney, Agent, or Firm*—Saile Ackerman LLC; Stephen B. Ackerman

(57) ABSTRACT

Formation, through etching, of structures whose minimum width is less than can be achieved by optical means alone has been achieved by inserting a layer of sandwiching material between the photoresist (or hard mask if used) and the structure. By adjustment of the relative etch rates of this layer and the structure, a uniform lateral width reduction and surface smoothing of the structure is achieved.

15 Claims, 6 Drawing Sheets

OTHER PUBLICATIONS

T. Mizuno et al., "Optical Spotsize Converter using Narrow Laterally Tapered Waveguide for Planar Lightwave Circuits", J. of Lightwave Tech., vol. 22, No. 3, Mar. 2004, pp. 833-839.

O. Mitomi et al., Optical Spot-Size Converters for Low-Loss Coupling Between Fibers and Optoelectronic Semiconductor Devices, J. of Lightwave Tehc., vol. 14, No. 7, Jul. 1996, pp. 1714-1720.

T. Bakke, et al., "Vertically tapered core polymaric optical spot-size transformer", Electron. Lett, vol. 37, No. 24, Nov. 11, 2001, pp. 1475-1476.

M. Itoh et al., "Large reduction of single mode-fibre coupling loss in 1.5% A planar lightwave circuits using spot-size converters", Electron. Lett., vol. 38, No. 2, Jan. 17, 2002, pp. 72-74.

K.K. Lee et al., "Effect of size and roughness on light transmission in a Si/$SiO_2$ waveguide: Experiments and model", Appl. Phys. Lett., vol. 77, No. 11, Sep. 11, 2000, pp. 1617-1619.

* cited by examiner

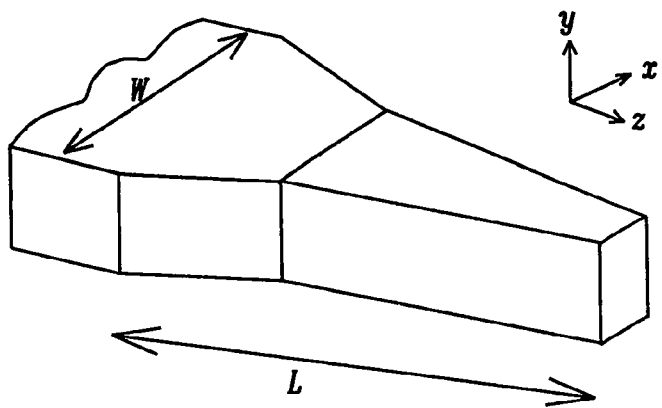
FIG. 1 – Prior Art
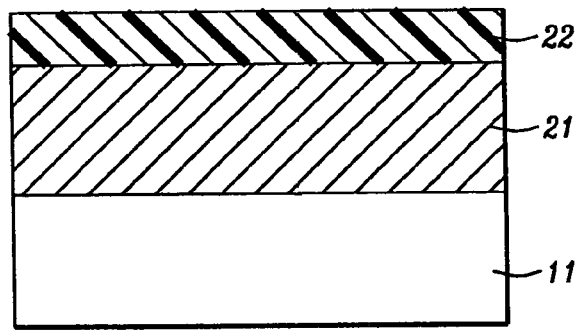
FIG. 2a – Prior Art
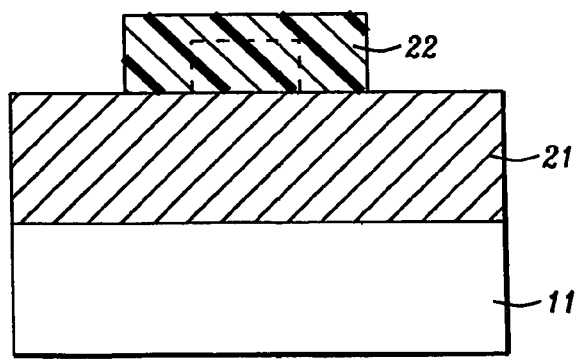
FIG. 2b – Prior Art

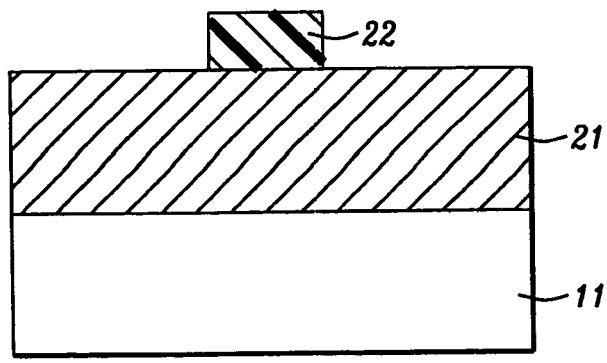
FIG. 2c – Prior Art
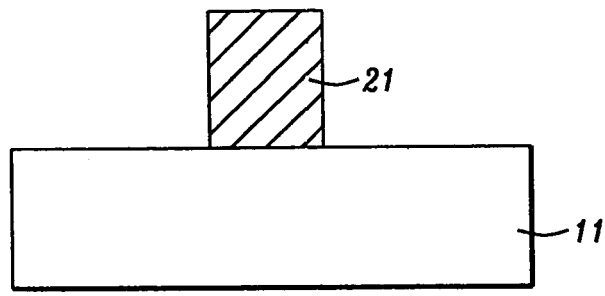
FIG. 2d – Prior Art
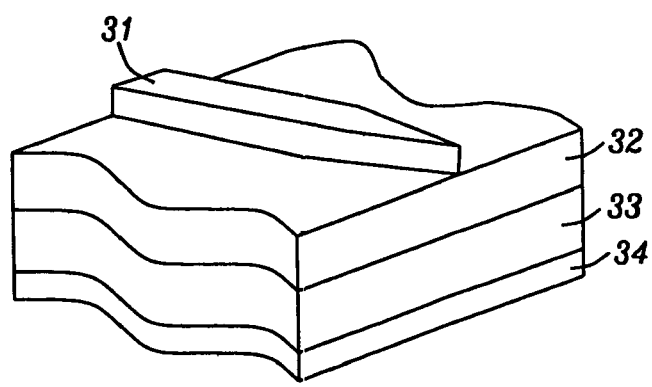
FIG. 3a – Prior Art

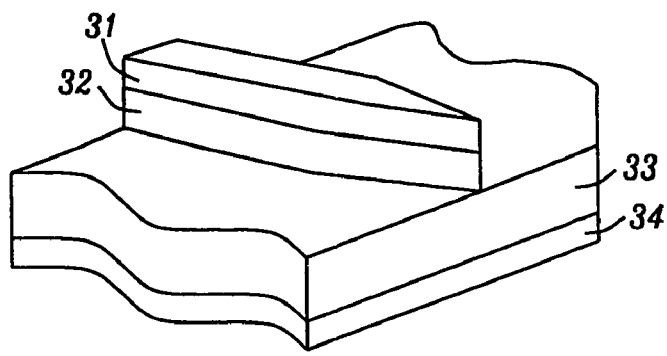
*FIG. 3b – Prior Art*
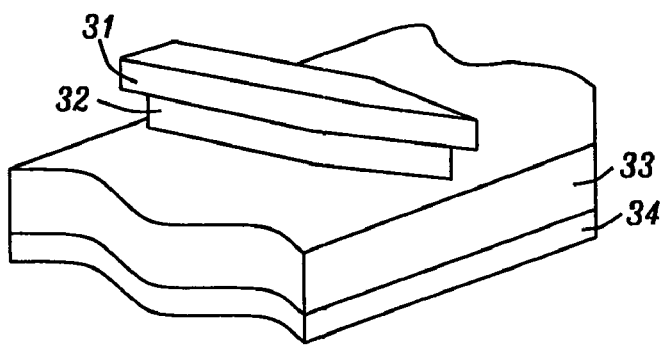
*FIG. 3c – Prior Art*
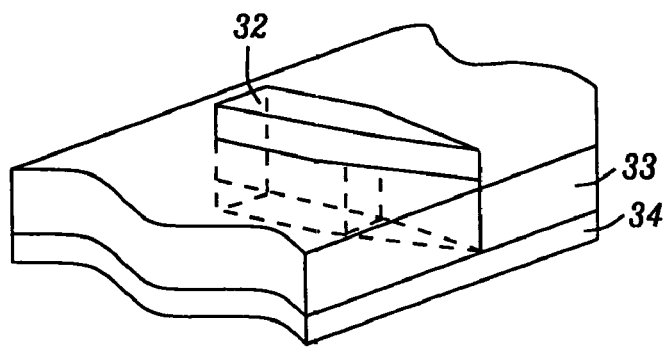
*FIG. 3d – Prior Art*

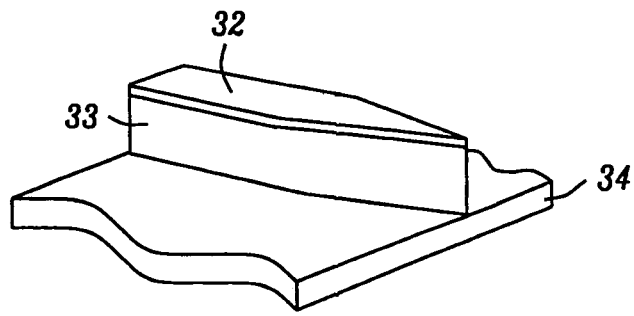
*FIG. 3e - Prior Art*
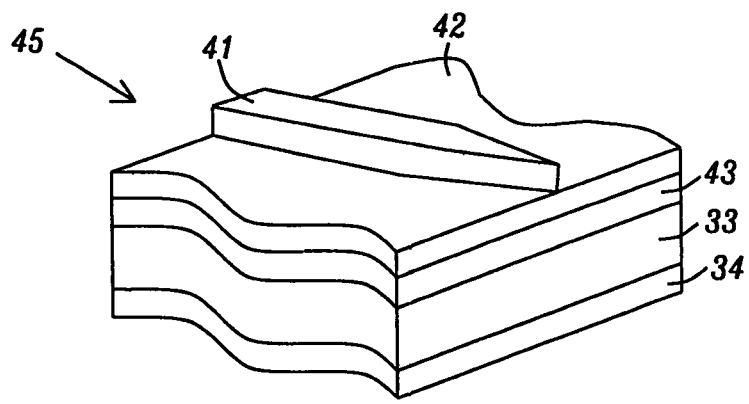
*FIG. 4a*
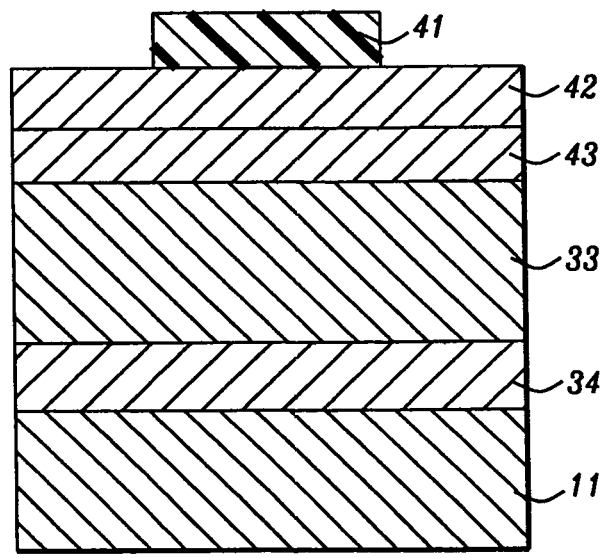
*FIG. 4b*

METHOD TO TRIM AND SMOOTH HIGH INDEX CONTRAST WAVEGUIDE STRUCTURES

This is a divisional application of U.S. patent application Ser. No. 10/922,541, filed on Aug. 20, 2004, now U.S. Pat. No. 7,162,133 which is herein incorporated by reference in its entirety, and assigned to a common assignee.

FIELD OF THE INVENTION

The invention relates to the general field of optical converters, more particularly to optical converters for bi-directionally converting the optical mode between two waveguides.

BACKGROUND OF THE INVENTION

Large scale monolithic integration of high performance electronic and photonic circuits on a single silicon chip is beginning to emerge. As reported by Graham R. Reed, "The Optical Age of Si", Nature, Vol 247, 12 Feb. 2004, p. 595, recent advances in Si as an optical material for light emitting devices, modulators and photo-detectors, shows the possibility of silicon based electronic and photonic integrated circuits. Optical waveguides are needed to interconnect between active photonic devices.

As electronic devices and circuits are scaled down, optical waveguides and passives which interconnect among the active photonic devices, and between electronic and photonic devices, also need to be scaled down. Large index contrast waveguides with small bending radius, i.e. r<30_m, are absolutely necessary. However, how to couple light from fiber to these miniaturized high index waveguides have been elusive. Typically, external fibers, having a low index difference between the core and the surrounding cladding layers and having a waveguide core of approximately 8-10 micron in diameter, have large mode field sizes, whereas a high index difference waveguide has a substantially smaller mode field and a much smaller cross section. This mismatch in mode size between an external fiber and an on-chip high index waveguide creates a connection loss, up to 20 dB, between the planar light wave chip and the external fiber when the two are directly connected. An abrupt change in the refractive index at the interface between an external fiber (a low index waveguide) and an on-chip high index waveguide, also causes transmitted power loss due to the reflection of the light wave signal.

US Patent Publication 20040037497 to Lee describes a method to resolve the coupling loss between external fibers and the miniaturized on-chip high index waveguide. He uses a double waveguide core, where the low index core is mode matched to the fiber at one end and mode matched with the embedded high index core at the other end through a mode converter. The high index core does all the interconnecting and passive functions and then optionally couples back to the low index core and thence to an output fiber.

The mode converter is where the high index waveguide is laterally tapered, [1-2], vertically tapered, [3-4], or vertically and laterally tapered [5], depending on the mode to be matched, the tapering length, L, the tapering tip, w, the tapering height, and, hence, the taper angles. All, would have to be designed carefully to achieve minimum coupling loss—see FIG. 1

The higher index contrast waveguide has the smaller mode side and therefore, to couple light into it, the spot size of the tapering tip would be smaller. CMOS compatible processes are mainly planar, because conventional single photolithography is used, so lateral tapering is chosen for the case where the width of the tapering tip gets narrower as we mode match light from the low index core to the higher index contrast core. As reported in ref. [2], the optimum width is 1.2 µm for low index contrast of 1.5%; we calculate the optimum width for a high index contrast of 40% to be 80 nm In photolithography, there is a trade-off between the thickness of the photoresist and the critical dimension (CD) of the feature. To resolve small features, photoresist has to be thin. When the photoresist is thin, etching a thick waveguide and trying to get a vertical profile is very challenging. Also, we note there are other problems such as erosion of photoresist at the isolated fine tapering tip, i.e. less than 150 nm. In milder cases, the photoresist is thinner at the last section. In the worst case, the photoresist disappears completely. Moreover, photoresist on very narrow tapering tip often bends. All of these listed process problems result in much higher coupling losses In U.S. Pat. No. 6,420,097, "Hardmask Trim Process", Pike describes a method to produce circuit structures having line widths which are smaller than what is achievable by conventional photolithographic techniques. The technique described enables the use of thin resist by trimming an underlying hard mask layer so that larger than required patterns can be first transferred using a conventional photolithographic technique with thin resist. However this technique requires special resist hardening processes just to perform the trimming of the hard mask itself. Furthermore, for thick dielectric stacks to be etched, particularly for photonic applications, thicker hard mask layers will need to be etched and trimmed first which will again be limited by the thickness of the photoresist available. In other words, a thicker hard mask requires thicker photoresist to etch, but with thicker photoresist we can not optically print small dimensions.

The final structure is then etched out under the trimmed hard mask. By using this method, the effect of hard mask erosion at the waveguide tips as described earlier will still be present. Though not as severe as in the case of using only photoresist as a masking layer, sidewall and tip roughening of the hard mask layer gets propagated to the target dielectric (waveguide core) layer to be etched and the roughening becomes progressively worse as the thickness of the dielectric material increases.

Another problem associated with high index contrast waveguides is surface roughness. The higher the index contrast, the greater the problem of scattering loss due to surface roughness becomes. Current smoothing techniques for Si waveguides involve oxidation of the waveguide core, [6]. However, for other high index waveguides, such as SiN, smoothing by oxidation is not practical due to the very high temperature needed as well as the catalyst used which will likely affect the refractive index of the SiN core.

A major concern in the conventional photolithographic process is that trimming of such resist will not leave a sufficient amount of mask material to allow complete etching of the underlying film. FIGS. 2a through 2b illustrate a typical method of producing features which are smaller than the capabilities of conventional photolithographic methods. Seen there are substrate 11, high index core layer 21, and photoresist layer 22. FIG. 2b shows the stack after resist patterning with an initial line width (solid black line). The wafers are then subject to a RIE trimming process which reduces the overall dimension of the resist pattern to the desired dimension (dotted line).

The reduced line width resist pattern is illustrated in FIG. 2c. The high index layer is then etched and the resist is stripped to form the final structure. FIG. 2d shows the final structure with dimensions that are smaller than what was achieved in the initial resist pattern. However, such a trimming method reduces the overall thickness of the resist pattern which inevitably causes erosion of the waveguide tip where the line width is smallest (<0.25 µm) as well as roughening of the waveguide side wall during the high index layer etching process. This problem becomes more prominent when a thick (>3000 Angstroms) high index layer needs to be etched. A thicker layer of resist may be used to overcome this problem. However, the use of thicker resist films limits the photo stepper's ability to resolve smaller features. Further trimming of the resist to achieve the desired dimensions again repeats the problem of reducing the resist thickness.

FIGS. 3a to 3e illustrate an alternative method of producing features that are smaller that what is achievable with conventional photo lithographic method. Seen there are hard mask layer 32, high index core layer 33, and low index cladding layer 33. In this method, the patterned resist 31, as illustrated in FIG. 3a, has to undergo another special resist hardening process to minimize resist loss during the subsequent hard mask anisotropic etch (FIG. 3b). This is followed by an isotropic trimming process of the hard mask layer 32 (FIG. 3c) to achieve a smaller line width feature than what was initially achieved during the resist patterning process. The resist 31 is then stripped (FIG. 3d), followed by the main etch of the high index layer 33 (FIG. 3e).

This method has several disadvantages. Trimming down the hard mask to the desired line width at such an early stage subjects the high index layer to erosion at the waveguide tip during the etching process. The hard mask may be more resistant to the etching plasma when compared to conventional photoresist but, for very small waveguide tip features, there is a tendency for the tips of the hard mask to be eroded much more quickly than the wider areas. The end result would be poorly defined waveguide tip features with very rough side walls.

This sort of problem becomes more serious when thick (>3,000 Angstroms) high index layers have to be etched. The use of a thicker hard mask layer to overcome this sort of problem will indirectly require a thicker layer of patterned resist to ensure sufficient protection for a complete etch of the hard mask. The thicker resist layer will also further limit the smallest feature size achievable by the lithography tool.

Another disadvantage of this method is that there are no provisions for smoothing of the high index waveguide walls. The severity of the inherent side wall roughening during the etching process depends on both the quality of the patterning technique used as well as the high index layer material used. Sidewall roughening of the waveguides results in higher light transmission losses and therefore must be reduced by a smoothing process. Yet another disadvantage of this method is that special resist hardening processes and equipment is needed for the successful trimming of the hard mask which adds cost to the entire production cycle.

REFERENCES

1. M. Ishii et al, "Low loss fiber pigtailed 256 channel arrayed waveguide grating multiplexer using cascaded laterally tapered waveguides," Electron. Lett., vol. 37, pp. 1401, 2001.
2. T. Mizuno et al, "Optical Spotsize Converter using Narrow Laterally tapered waveguide for planar lightwave circuits," J. of Lightwave Technology, vol. 22, pp. 833, 2004.
3. O. Mitomi et al, "Optical spot size converters for low loss coupling between fibers and optoelectronics semiconductor devices," J. Lightwave Technolo., vol. 14, p. 1714, 1996.
4. T. Bakke et al, "Vertically tapered core polymeric optical spot size transformer," Electron. Lett., vol. 37, p. 1475, 2001.
5. M. Itoh et al, "Large reduction of single mode fiber coupling loss in Q 1.5% planar lightwave circuits using spot size converters," Electron. Lett., vol. 38, p. 72, 2002.
6. K. K. Lee et al, "Effect of size and roughness on light transmission in a Si/SiO2 waveguide: Experiments and model", Appl. Physics Letters, Vol. 77 No. 11, 11 Sep. 2000.

SUMMARY OF THE INVENTION

An object of the present invention is to provide a method to produce optical waveguide converters (or circuit structures) with line widths that are much smaller than what is achievable by conventional photolithographic techniques on thin resist. Said method to trim a target dielectric layer or waveguide core to a desired thickness while simultaneously smoothing its side wall surface.

Another object of the present invention is to provide an improved method of making optical converters that have line widths which are smaller than what is achievable by conventional photolithographic techniques on ultra thin resist even for thick (>3000 Angstroms) optical core film stacks.

A further object of the present invention is to provide a method to simultaneously trim (in the lateral direction) and smooth the waveguide core directly without affecting its vertical dimension.

These objects have been achieved through a method of forming waveguide structures which are smaller than what is possible when using the current photo-lithographic techniques. An optical waveguide stack is formed on a substrate on which is formed a low index cladding layer followed by a high index core layer and then followed by a top "sandwich" layer. A final (optional) hard mask layer may be added for RIE (reactive ion etching) of very thick high index core layers. Depending on the specific application, the top "sandwich" layer will provide one or more of the following functions:

a) As a top low index cladding layer for a double core waveguide fabrication process.

b) As a secondary hard mask layer for the subsequent RIE etching process.

c) As a top protective layer for the high index core layer which prevents top surface roughening of the high index core layer in subsequent processes.

d) To prevent any vertical dimension loss during the trimming and smoothing process.

The sandwich layer applications noted in b) and c) above have already been disclosed in an earlier IME patent entitled "Method of Fabricating Optical Waveguide Devices With Smooth And Flat Dielectric Interfaces", filed on Dec. 3, 2003 as application Ser. No. 10/727,201. A resist mask is formed which has an initial line width. The optional metal or dielectric hard mask layer, top "sandwich" layer and high index core layers are then etched anisotropically in a RIE system. The resist layer and the hard mask layer (if present) are then removed. The high index core is then trimmed laterally and smoothed simultaneously in a suitable liquid or gaseous chemical etchant to the final line width which is much narrower than the initial line width of the resist mask. Vertical dimensions of the high index core will not be affected as it is protected by the top "sandwich" layer.

BRIEF DESCRIPTION OF THE DRAWINGS

FIG. 1 is an isometric view of a typical optical mode converter.

FIGS. 2a through 2d illustrate a common method for etching a narrow line.

FIGS. 3a through 3e illustrate an improved method for etching a narrow line wherein a hard mask, or hard baked photoresist, remain in place while etching of the line is allowed to continue.

FIGS. 4a and 4b show the key feature of the present invention which is the insertion of a sandwich layer between the resist/hard mask and the structure to be etched.

DESCRIPTION OF THE PREFERRED EMBODIMENTS

Figure 5A:
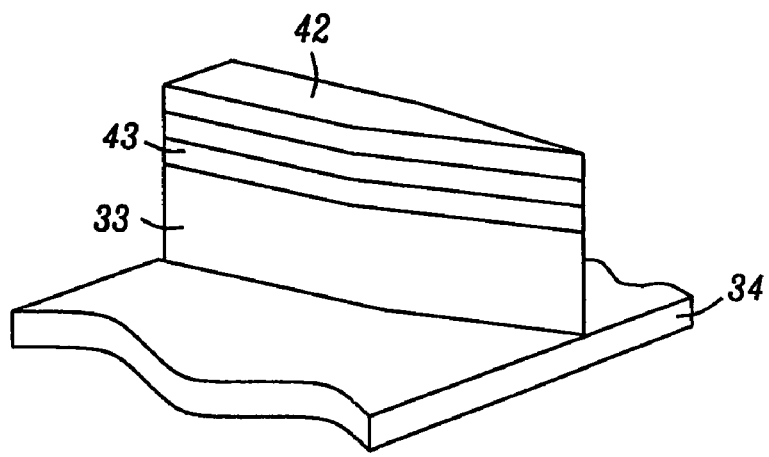
FIGS. 5a and 5b show the appearance of the structure of FIG. 4 after it has been subjected to anisotropic etching in a vertical direction.

In order to overcome the various problems that have been reviewed in the BACKGROUND section, the present invention teaches an improved method of trimming the waveguide line width to dimensions which are much narrower than what is achievable with conventional photolithography while simultaneously smoothing the waveguide (high index layer) side walls. FIGS. 4a to 6b illustrate the simultaneous trimming and smoothing process flow for thick waveguides. The method comprises the steps of providing a film stack and forming a resist mask 41 having an initial line width as illustrated in FIG. 4a. Resist 41 lies on (optional) hard mask layer 42. A key novel feature of the invention, sandwich layer 43, lies between layer 42 and high index core layer 33. FIG. 4b is a view of the film stack along direction 45. The hard mask and top "sandwich" layers are anisotropically etched using plasma RIE systems, followed by removal of the resist.

Figure 5B:
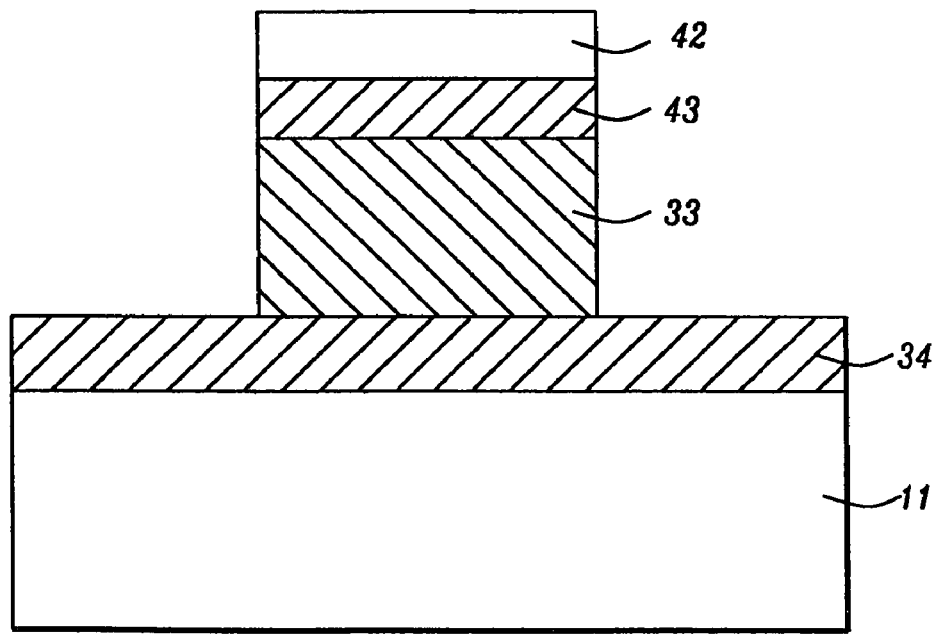
Figure 6A:
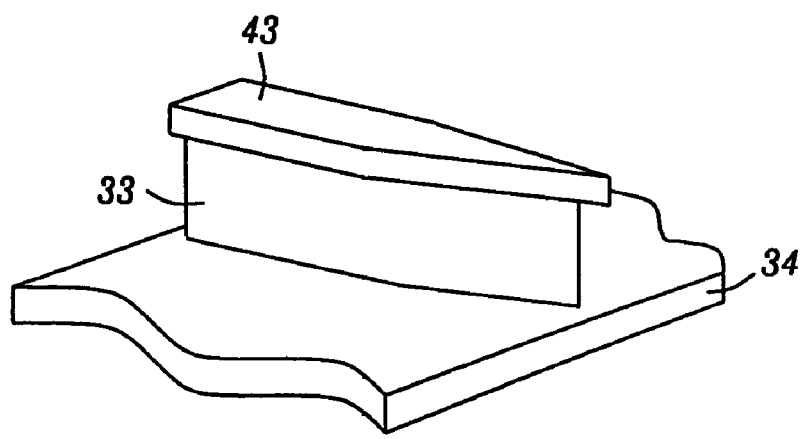
FIGS. 6a and 6b show the appearance of the structure of FIG. 5 after it has been subjected to isotropic etching during which said sandwich layer has been partly consumed.
Figure 6B:
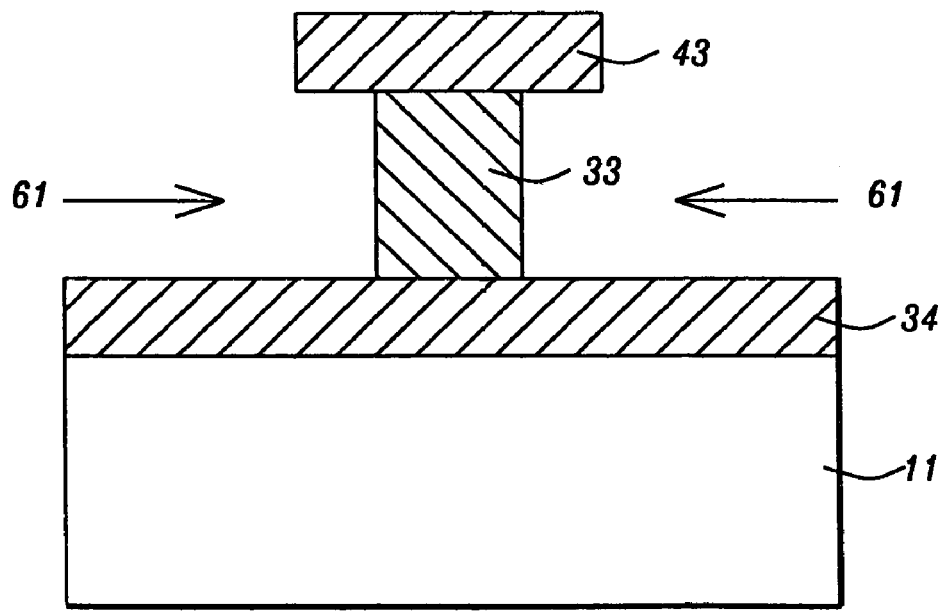

This is followed by the main anisotropic etch of the waveguide core layer (high index layer) as illustrated in FIGS. 5a and 5b. The additional hard mask layer is then removed as well using either a wet or dry chemistry which is selective to the additional hard mask layer. The trimming and smoothing process follows using a highly selective isotropic wet or dry chemistry that etches the waveguide core laterally (see directions 61). It is a key feature of the invention that the waveguide height remains essentially unchanged as it is protected by the top "sandwich" layer. FIGS. 6a and 6b illustrate the end result of the process of the invention.

The invention thus overcomes the problem of waveguide tip erosion for very small line widths during the waveguide core etching process by allowing:

a) Thicker resist layers may be used even though the minimum lithography pattern feature size becomes larger.

b) Thicker hard mask layers to be used for etching very thick wave guide core layers (high index layer) since much larger resist patterns can now be used.

We now further illustrate the invention through the following non-limiting examples:

EXAMPLE 1

In a situation where the waveguide stack is made up of a Silicon substrate followed by a bottom Silicon Oxynitride cladding, on top of which is deposited a thin layer (<5000 Angstroms) of Silicon Nitride waveguide core layer followed by a Silicon Oxynitride "sandwich" layer. In this example the additional hard mask layer is not used. Waveguide resist patterns with an initial tip width $\geq 0.25$ μm can be reliably patterned onto the top Silicon Oxynitride "sandwich" layer with 3-5,000 angstroms resist using a conventional photolithography tool. The Silicon Oxynitride top sandwich layer followed by the Silicon Nitride layer are anisotropically etched using a conventional plasma RIE system. The remaining photoresist residues are then removed using either a wet chemical strip or plasma stripping process.

In this example where Silicon Nitride is used as the waveguide core material, side wall roughening tends to be inherently produced during the anisotropic etching process. Roughening severity increases with the thickness of the Silicon Nitride layer being etched. The Silicon Nitride waveguide core is then trimmed down laterally and smoothed simultaneously by immersing it into a highly selective solution of $H_3PO_4$ solution. Etching selectivity of the Silicon Nitride to Silicon Oxynitride can be controlled by the temperature and concentration of the $H_3PO_4$ solution. Selectivity of 30:1 or more can be controlled by heating the $H_3PO_4$ up to 155-160% C. and maintaining its boiling point at this temperature by injecting water into the solution to replace water loss from the boiling $H_3PO_4$ solution. Vertical height loss of the Silicon Nitride core is prevented by the top "sandwich" layer of Silicon Oxynitride.

EXAMPLE 2

In a situation where the waveguide stack is made up of a Silicon substrate followed by a bottom Silicon Oxynitride cladding, on top of which is deposited a thick layer (>5000 Angstroms) of Silicon Nitride waveguide core layer followed by a Silicon Oxynitride "sandwich" layer. In this case an additional Aluminum hard mask layer will be required. Waveguide resist patterns with an initial tip width $\geq 0.25$ μm can be reliably patterned onto the Aluminum hard mask layer with 3000-5000 Angstroms resist using a conventional photolithography tool.

The Aluminum hard mask, Silicon Oxynitride top sandwich layer and Silicon Nitride layer are anisotropically etched using a conventional plasma RIE system. The residual photoresist and Aluminum hard mask are then removed using either a wet chemical strip or plasma stripping process. In the case where Silicon Nitride is used as the waveguide core material, side wall roughening tends to be inherently produced during the anisotropic etching process. The degree of roughening increases with the thickness of the Silicon Nitride layer being etched.

The Silicon Nitride waveguide core is then laterally trimmed and simultaneously smoothed by immersing it into a highly selective solution of $H_3PO_4$ solution. Etching selectivity of the Silicon Nitride to Silicon Oxynitride can be controlled by the temperature and concentration of the $H_3PO_4$ solution. Selectivity of 30:1 or more can be controlled by heating the $H_3PO_4$ up to 155-160° C. and maintaining its boiling point at this temperature by injecting water into the solution to replace water loss from the boiling $H_3PO_4$ solution. Vertical height loss of the Silicon Nitride core is prevented by the top "sandwich" layer of Silicon Oxynitride. 6-7,000 angstrom thick Silicon Nitride waveguides with 0.15 μm to 0.2 μm tips can be achieved using this method.

EXAMPLE 3

In situations where the waveguide stack consists of a Silicon substrate on which lies a bottom Silicon Dioxide cladding, on top of which is deposited a layer of Silicon waveguide core layer followed by a Silicon Nitride "sandwich" layer. An additional hard mask layer may be used on top of the Silicon Nitride "sandwich" layer if a very thick Silicon waveguide core layer needs to be etched.

In this example we will assume that the Silicon waveguide core layer is not thick enough to necessitate the use of an additional hard mask. Waveguide resist patterns with an initial tip width ≧0.25 μm can be reliably patterned onto the top Silicon Nitride "sandwich" layer with 3-5,000 Angstroms resist using a conventional photolithography tool. The Silicon Nitride top "sandwich" layer followed by the Silicon waveguide core layer are anisotropically etched using a conventional plasma RIE system. The remaining photoresist residues are then removed using either a wet chemical strip or plasma stripping process. The Silicon waveguide core is then trimmed down laterally and smoothed simultaneously by immersing it in a highly selective solution of heated KOH or $HNO_3+H20+NH_4F$ mixture. As an alternative trimming chemistry one may use an isotropic plasma RIE Silicon etch chemistry. Vertical height loss of the Silicon Nitride core is prevented by the top "sandwich" layer of Silicon Nitride.

CONFIRMATION OF THE EFFECTIVENESS OF THE INVENTION

The data summarized in TABLE I below show the substantial performance difference that has been achieved through application of the invention.

TABLE I

| Mean Mode Transformer Loss | PRIOR ART | INVENTION |
| --- | --- | --- |
| Worst case | 6.6 dB per facet | 0.5 dB per facet |
| Best case | 2.2 dB per facet | 0.1 dB per facet |

While the invention has been particularly shown and described with reference to the preferred embodiments thereof, it will be understood by those skilled in the art that various changes in form and details may be made without departing from the spirit and scope of the invention.

What is claimed is:

1. A method of forming a thick waveguide having a tapered region that includes a fine tip, comprising:
    on a substrate, providing a film stack that includes a high refractive index core and a low refractive index cladding layer;
    depositing a dielectric sandwich layer on said stack;
    depositing a hard metal mask on said dielectric sandwich layer;
    depositing and patterning a photoresist layer on the metal hard mask layer and then forming a metal hard mask having a first minimum width;
    anisotropically etching all exposed areas in a vertical direction and then removing any residual photoresist; and
    then removing said metal hard mask and isotropically etching, using a wet chemistry etchant that preferentially etches said film stack relative to said sandwich layer, whereby said film stack acquires a second minimum width that is less than said first minimum width.

2. The method according to claim 1 wherein said second minimum width is less than could be achieved through optical means alone.

3. The method according to claim 1 wherein said second minimum width at the tip of the tapering region is less than about 0.35 microns.

4. The method according to claim 1 wherein said the high refractive index core has a refractive index that exceeds that of said cladding layer by 0.2 or more.

5. The method according to claim 1 wherein said high refractive index core material is selected from the group consisting of silicon nitride, aluminum oxide, tantalum oxide, hafnium oxide, titanium oxide, polyimide, silicon, and GaAs and said low refractive index cladding material is selected from the group consisting of silicon oxide, air, doped silicon oxide, silicon oxynitride, and AlGaAs.

6. The method according to claim 1 wherein said metal hard mask is aluminum or chromium.

7. The method according to claim 1 wherein said tip in the tapered region has a width that is less than 0.35 μm and a height that is at least four times said width.

8. The method according to claim 1 wherein said sandwich layer is of the same material as said cladding material unless said cladding material is air.

9. The method according to claim 1 wherein said isotropic etch etches said core material at least 5 times faster than it etches said sandwich layer.

10. The method according to claim 1 wherein said isotropic etch is applied directly to said core material.

11. The method according to claim 1 wherein said sandwich layer further serves to prevent damage to a top surface of said waveguide during plasma etching, photoresist stripping, and polymer cleaning.

12. The method according to claim 1 wherein the step of anisotropically etching further comprises etching until all unprotected portions of said core layer have been removed and then over-etching so as to remove a portion of said bottom cladding layer, thereby preventing shorting between waveguides.

13. The method according to claim 1 wherein a wet chemistry or a gas chemistry is used.

14. The method according to claim 13 wherein said wet chemistry is selected from the group consisting of $H_3PO_4$, KOH, HF+$HNO_3$ mixture, and tetraethyl ammonium hydroxide.

15. The method according to claim 13 wherein said gas chemistry is a plasma gas mixture selected from the group consisting of HF vapor, $O_3$+HF vapor, $SF_6$, HBr+$Cl_2$, and $CF_4$+$CHF_3$.

* * * * *